(12) United States Patent
Jung et al.

(10) Patent No.: US 8,761,556 B2
(45) Date of Patent: Jun. 24, 2014

(54) LIGHT GUIDE DEVICE HAVING MULTI CHANNELS

(76) Inventors: Taerok Jung, Seoul (KR); Jaeheun Jung, Seoul (KR)

( * ) Notice: Subject to any disclaimer, the term of this patent is extended or adjusted under 35 U.S.C. 154(b) by 0 days.

(21) Appl. No.: 13/261,439

(22) PCT Filed: Nov. 10, 2010

(86) PCT No.: PCT/KR2010/007909
§ 371 (c)(1),
(2), (4) Date: Sep. 24, 2012

(87) PCT Pub. No.: WO2011/083907
PCT Pub. Date: Jul. 14, 2011

(65) Prior Publication Data
US 2013/0011097 A1   Jan. 10, 2013

(51) Int. Cl.
*G02B 6/26* (2006.01)
*G02B 6/10* (2006.01)

(52) U.S. Cl.
USPC ................. 385/31; 385/47; 385/900

(58) Field of Classification Search
USPC .................................. 385/47, 900
See application file for complete search history.

(56) References Cited

U.S. PATENT DOCUMENTS 6,973,234 B2 * 12/2005 Hasegawa et al. ............. 385/31

* cited by examiner

*Primary Examiner* — Omar Rojas
(74) *Attorney, Agent, or Firm* — GWiPS

(57) ABSTRACT

A new concept of the light guide device has developed to have multi channels, the present invention comprises: a transparent body through which light can freely pass; channel condensing units disposed at predetermined intervals on the body to form a plurality of one-dimensional arrays; an optical module unit for independently sighting incident light, and re-sighting and focusing light which passes through the one-dimensional arrays formed by the channel condensing units disposed at predetermined intervals in the body; and a fiber channel module for creating independent light passages (fiber channels) which condense light from the left, right, up and down aspects of the optical module unit, at a one-to-one correspondence between the body and the optical module unit. The present device maximizes the efficiency of the solar energy utilization by reducing the guide distance of incident light. The simplified structure is easy to produce and install by using a flat, slim plate that is compact in size, lowering the production cost.

14 Claims, 6 Drawing Sheets

1

LIGHT GUIDE DEVICE HAVING MULTI CHANNELS

BACKGROUND OF THE INVENTION

1. Field of the Invention

The present invention relates to a light guide device having multi-channels. More particularly, the incident lights at a predetermined angle will collimate in a form of a parallel light beam. Either one of an independent collimating means or a combined condensing means with the collimating means for connecting the parallel incident beams from its front will be selectively arranged to form an optical module. Each optical module will correspond one-by-one. The incident light beams from the optical module will be totally reflected to form its own light passages (also called "channels"). Accordingly, a light guide device of the present invention will simultaneously advance the multiple rays of light forwarding to a specifically intended direction. Specifically, the light guide device of the present invention is comprised of: a first horizontal reflection unit for totally reflecting the light beams from left to right, or front-side to rear-side; a first vertical reflection unit formed at the same height as the first horizontal reflection unit and separated by the unique distance, which is different from each other, for totally reflecting upward and downward the light rays incident from the first horizontal reflection unit; a second horizontal reflection unit corresponding, to the first vertical reflection unit one-to-one for totally reflecting the light beams from front-to-rear or left-to-right, incident from the first vertical reflection unit; and multiple light beams being incident front-to-rear from the second horizontal reflection unit through the light channel module formed with the second horizontal reflection unit will not be disturbed by the optical module, the first horizontal reflection unit, the first vertical reflection unit, or the second horizontal reflection unit. Each unit will form its own independent channel. At the same time, a large number of the optical lights will travel in its own light passage of the specific directions: front-to-rear, left-to-right, and upward-to-downward. The plain type of the present light guide device is arranged with a plurality of the optical modules for totally reflecting the incident lights at a predetermined angle to the specific direction. The present light guide device has merits to efficiently utilize the incident light beams, to increase the space utilization, to reduce the product cost, and is easy to handle, etc.

2. Related Prior Art

Generally, the solar energy can be converted to a form of light-work, such as when: the solar generation utilizes the solar energy to produce electricity; the solar energy collector and solar cell panels absorb the solar energy to generate hot water and to provide home heating; the natural day-light module or the light reflective panel utilize the solar energy to take advantage of photo-catalytic solar day lighting or photovoltaic plant-growth lighting or illumination.

In order to utilize the solar energy, the solar energy collector is essential for condensing the solar energy. The solar energy collector is used for the solar generator, the natural day-light module, and the solar cell panels, etc. The efficiency of the solar energy condensing device is directly related to the efficiency of the solar energy utilization.

The solar energy condensing device is classified as the Point Focus Dish Type, Point Focus Fresnel Lens Type, Linear Concentrating Fresnel Lens Type, and Heliostat Type/Gregorian/Cass-grain. Some solar concentrator device uses a holographic prism sheet condenser. The solar energy condensing device adopts the principle of optics and ultimately employs the condensing lens and condensing mirror.

The aforementioned conventional solar energy concentrator requires a large scale of structures to increase their capacity of the solar energy accumulation. For increasing the capacity of the solar generation, solar energy collection, or day-light collection, the facility of the solar energy concentration is inevitably growing in a larger structure. Therefore, the construction cost will increase, so that it is difficult to expect the economical benefit comparing the investment.

Accordingly, it is essential to develop the technology of the solar energy concentration having the maximum efficiency with the minimum collecting area in order to have the economical benefits compared to the investments.

There are a number of light guide devices for concentrating the solar energy or natural daylight, which has been previously published. However, the conventional device has a lot of problems to concentrate the incident light beams from front-to-side, and it has low efficiency.

A conventional light guide device known as a typical technology for concentrating solar energy was published in the Japanese Patent No. 2000-147262.

FIG. 8 shows a conventional light beam receiver (20). A plurality of optical transmitting layer (24, 34, 44) is transmitted the solar beams (45, 50, 55, 60, 65, 70, 75, 80, 85, 90, 95, 100) downward. An optical deflector (28, 38, 48) is disposed under the optical transmitting layer. The optical deflector is the same size as the optical transmitting layer, and the solar cells have arranged oppositely at both ends of the optical transport layer lengthwise. The bottom surface of the optical deflector has formed a continuously serrated shape so that the light reflector (50) can be installed on its entire surface.

The solar beam permeates through the optical transmitting layer from the light beam receiver and totally reflects the solar beams coming from the serrated surface of the optical reflector to the incident angle being below the critical angle, or retransmitting to the optical transmitting layer for the repeating reflection within the optical transmitting layer. Finally, the solar beam transmits to the solar cells.

The conventional method described above has a disadvantage that the travel distance of the beam is prolonged depending on the beam incident angle and the number of reflections. Due to this disadvantage, the beam will decay out and be lost. Further, it forms a double structural layer of the optical transmitting layer and optical reflecting layer. Due to the complicated structure, the manufacturing cost will be relatively high. Also, the conventional device of the structure has a weak point for direct sunlight. If the sunlight has a vertical incident angle, then the reflecting rate will be lower.

Another conventional light guide device for concentrating the solar energy is shown in the U.S. Patent Publication No. 2010-0024805.

As shown in FIG. 9, a conventional solar beam concentration devise (900) has disclosed for concentrating the solar beam through the collecting lens. Then, the concentrated solar beam (750) is transmitted through the elements (754) of beam receiver (752) to the light wafer sheet (726) connected to the cross-sectional unit (910) for total reflection on the surface of the light wafer sheet. The concentrated solar beam (930) is passing through the channel? (726).

The second example of the light guide device is employing more than two optical collecting lenses for concentrating the solar beam. However, it has multiple sheets of the light transmitting membranes with a complicated structure. Due to the reflection in the complicated structure and the multiple light transmitting membranes, this device has a disadvantage to lose the concentrated beams. It will be especially complicated and expensive for the design of the critical reflecting angles to reflect the solar beam on the entire surface of the light transmitting membranes. Because the concentrated solar beam is not parallel, it is difficult to focus on one point, and the focus will be large. Therefore, the less expensive light guide device is required.

The third example, Korean Patent No. 933213 is published to show a conventional light guide device for concentrating the solar energy.

As shown in FIG. 10, another conventional light guide device comprises a collecting lens unit (100) forming a number of the convex lenses (110) for collecting the solar beams (111) on its upper surface, and the groove unit (120) is formed to correspond to the collecting lens on the lower surface of the collecting lens unit. The groove unit (120) has formed a conical shape at one side (122) and other side (121) designed not to permeate the reflected solar beams. Also, a number of the groove units (120) have formed the conical shape to be located on the axis of the optical focus (F1) of the collecting lens unit (110). Therefore, the optical focus of the collecting lens unit lies on the optical focus of the conical shape within a limited space. Accordingly, the solar beams transmitted to the collecting lens unit are collected on a focus of the collecting lens. Then, it will be reflected by the surface of the conical shape. Finally, the concentrated solar beams are collected on the surface of the solar cells.

However, the third example of the conventional device also has problems. Even though the device employs the collecting lens, the solar beams being collected by the collecting lens unit are not parallel. Therefore, this device has the same problems as the second conventional device. The conical surfaces require precise design and manufacturing. Thus, the cost of design and manufacturing of the conical surfaces of the groove units is expensive. Furthermore, the conical surfaces of the groove units have no compatibility, and so it is not an economical device.

In order to solve the aforementioned problems, the inventor of the present invention improves the solar energy concentrating device to make it a compact size and to arrange multiple arrays. The present device tracks the solar azimuth and the elevation angles, simultaneously. The transmitted solar beams are guided by the blinder to travel in parallel.

The present inventor has invented and published the Korean Patent No. 10-2009-0129310, which discloses the dual axis as having a solar tracking capability combined with a blinder applied to the solar energy generator, and the Korean Patent No. 10-2010-0000007, which discloses the dual axis solar tracking vertical hydro-blinder. The above patents are related to the improvement of the efficiency of the solar energy concentrating device for guiding the transmitted solar beam to be parallel by the dual axis of the solar tracking device. The third Korean Patent No. 10-2010-0004153 discloses the lateral solar energy concentrating device being applied to the dual axis of the solar tracking device. It has multiple solar beam-collecting units and reflecting units, which arrange the multiple beam collecting modules of the lenses and mirrors to collect the transmitted solar beams from the front. In order to improve the efficiency of the solar energy concentrating device, the solar beam collector has a lateral unit at either side below or above the solar beam concentrating unit. The purpose of this lateral unit is to make an initial transmission of the solar beam, and to reflect the first transmitted solar beam through the reflecting unit to the lateral unit, which then concentrates the solar beams. The fourth Korean Patent No. 10-2010-6250 discloses the hybrid prism solar energy concentrating device as a device that has multiple reflecting units on both the upper and the lower surfaces of the collecting units. This reduces the thickness of the solar energy concentrating device and provides a gradual concentrating and lateral solar beam collecting capability. The fifth Korean Patent No. 10-2010-0006756 discloses the prism solar energy concentrating device for maximizing the efficiency of the solar energy concentrating units and reducing the production cost to be economical versus the investments.

As described above, the present invention is provided to solve the problems in the conventional technology. The main objective of the present invention is to develop the light guide device adopting the Channel Prism for remarkably shortening the light traveling distance, when the solar beam transmits to the lateral concentrating device from the front.

SUMMARY OF THE INVENTION

The objective of the present invention is to provide a light guide device having multi channels. The light guide device comprises that: more than two parallel incident beams are guided through each channel; a permeable body (10) is for permeating the lights; a channel optical concentrating unit (20) is formed on the body (10); more than two optical channel modules (40) arranged with constant interval on the permeable body (10) are for guiding a parallel incident light (11b) from each optical module unit (21) through each unique channel; and a discharged light (11c) from the optical channel module (40) will not interfere with each other by the unique channel.

Preferably, the light guide device having multi channels further provides: a first horizontal reflection unit for totally reflecting the lights, which advances parallel from the optic module unit. The optical channel module being formed corresponds to the optic module unit upward and downward. Each unique channel has a different depth for each channel module to each first horizontal reflection unit, wherein each optic module unit (21) and the corresponding first horizontal reflection unit is lined up in the horizontal direction to form its own unique channel, so that each unique channel will not interrupt each other.

Preferably, the light guide device having multi channels further provides: a first vertical reflection unit for totally reflecting the lights incidentally parallel from the first horizontal reflection unit, the optical channel module being formed to correspond to the optic module unit upward and downward, and each unique channel being formed with different depths for each channel module toward each first vertical reflection unit. A second horizontal reflection unit is arranged to correspond to the first vertical reflection unit upward or downward for totally reflecting the transmitted lights for final output. Each optic channel module forms its own unique channel having a different distance for the light to travel between the first horizontal reflection unit and the first vertical reflection unit, so that each unique channel will not interrupt each other.

Furthermore, the light channel module has included a third horizontal reflecting unit for totally reflecting the transmitted beam from the second horizontal reflecting unit to the horizontal direction.

The light channel module is further comprised of: preferably, the permeable body (10) having a predetermined area and thickness, an optical refraction rate larger than that of air, and optically transparent material. The permeable body (10) is made one of a plastic, tempered glass, pyrex, quartz, or silicon.

Preferably, each reflecting unit has a concave groove being formed as a reversed V-shape or a right triangle shape on the permeable body (10). The bevel surface of the concave groove will totally reflect the parallel lights from a dense medium to a less-dense medium, according to the principle of a right angle prism to form an optical passage.

The bevel surface of the concave groove forms a reflecting layer to increase the efficiency of the reflection rate, and the reflecting layer is selectively coated with one of aluminum, silver, gold, nickel or stainless steel. Preferably, each reflecting unit is formed with a reflecting mirror attached to the body.

Preferably, the light channel module further comprises the optical concentrating unit to form a linear arrangement, selecting one of a linear optical concentrating convex lens unit, a linear optical concentrating Fresnel lens unit, a linear optical concentrating non-convex lens unit, a linear optical concentrating Green lens unit, a linear optical concentrating Fiber-optic taper unit, a linear optical concentrating Gregorian optical mirror unit having a bottom window, an optical concentrating convex lens unit, an optical concentrating Fresnel lens unit, an optical concentrating non-convex lens unit, a Diffusion Green lens, an optical concentrating Fiber-optic taper unit, a Gregorian optical mirror unit, or a Cass grain optical mirror unit.

Preferably, the light channel module is further comprised of: the first horizontal reflecting unit having a prism for splitting the incident solar beams according to the wavelength; a partial portion of the split beams being guided in the vertical direction; and the rest of the split beams being guided to be reflected in the horizontal direction.

Preferably, each optical module unit has a light concentrating means for the incident solar beams at the front first. The light concentrating means selects one of a Fresnel lens, a non-convex lens, a Cass grain optical concave mirror, or a Gregorian Optical Prism.

Preferably, a half sphere convex lens forms a beam collecting lens in its upper portion. The convex lens has the capability to collect the solar beams while the solar azimuth and the elevation angles vary without a separate tracking device.

Preferably, the light channel module further has a third concentrating unit for concentrating the linear parallel solar beams. The two-time concentrated beam by the second guide unit will enter to the third concentrating unit.

Accordingly, the present invention has advantages including the improvement of the efficiency for utilizing the solar energy through a shortening optic travel distance by guiding the incident beams. It also has the simplified structure of the flat panel style having a light weight and being compact to reduce the production cost.

DETAILED DESCRIPTION OF THE PREFERRED EMBODIMENTS

Hereinafter, the light guide device having multi channels of the present invention will be described in detail accompanied with the drawings. The purpose of the attached drawings is for easily understanding the explanation of the present invention. The ordinary person in this art must know that the invention is not limited to the description and the drawings of the present invention.

Figure 1:
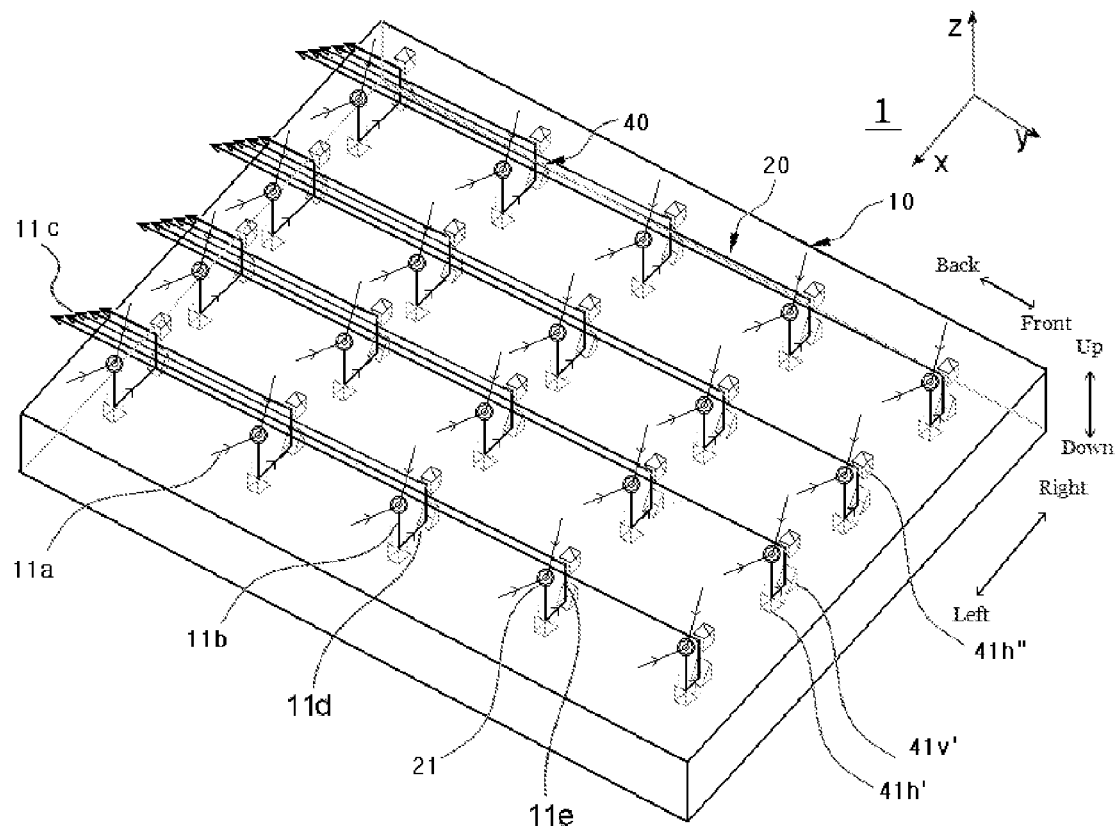
FIG. 1 is a perspective view illustrating a basic concept of the light guide device having multi channels of the present invention.
Figure 2:
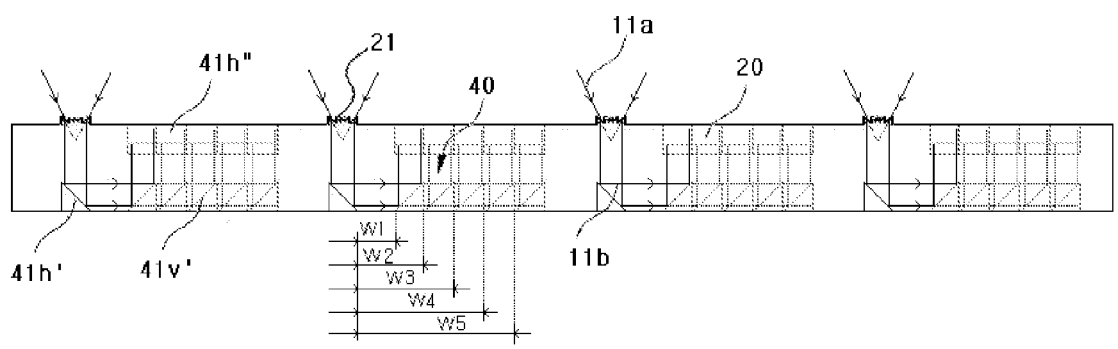
FIG. 2 is a side view illustrating a structure of the light guide device having multi channels of the present invention.
Figure 3:
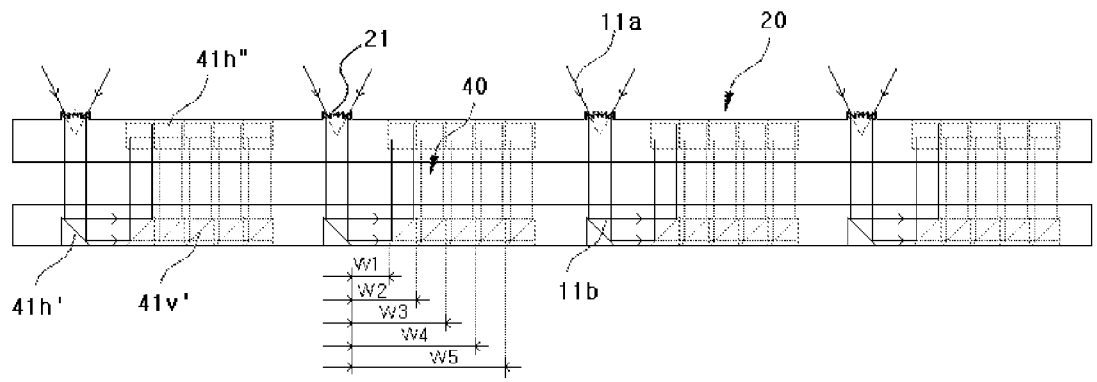
FIG. 3 is a disassembly view illustrating the manufacturing of the light guide device having multi channels.
Figure 4:
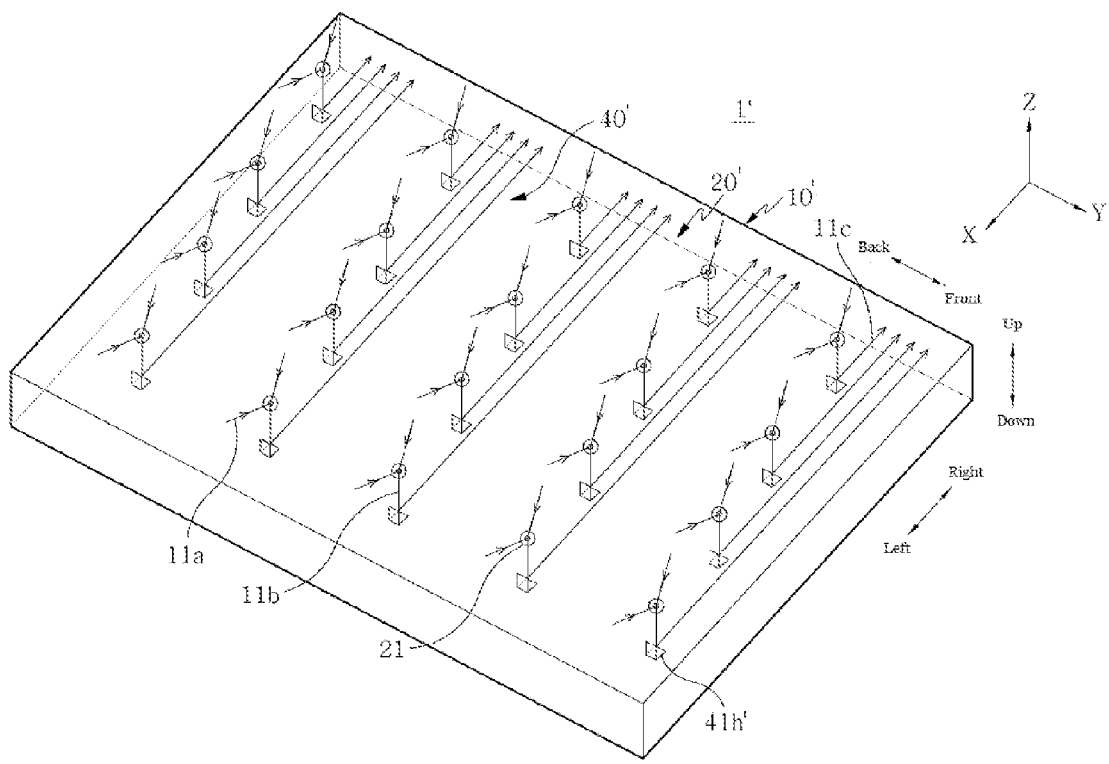
FIG. 4 is a perspective view illustrating an alternative concept of the light guide device having multi channels.

As shown in the drawings, FIG. 1 is a perspective view illustrating a basic concept of the light guide device having multi channels of the present invention. FIG. 2 is a side view illustrating a structure of the light guide device having multi channels of the present invention. FIG. 3 is a disassembly view illustrating the manufacturing of the light guide device having multi channels. FIG. 4 is a perspective view illustrating an alternative concept of the light guide device having multi channels.

Figure 5:
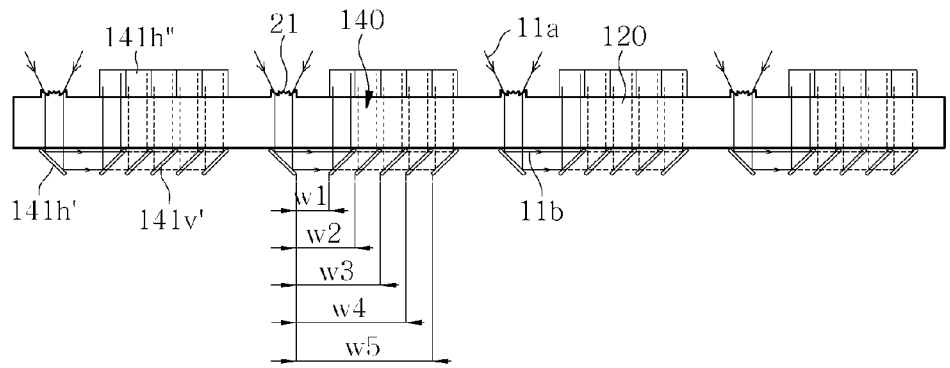
FIG. 5 is a side view illustrating an alternative structure of the light guide device having multi channels.
Figure 6:
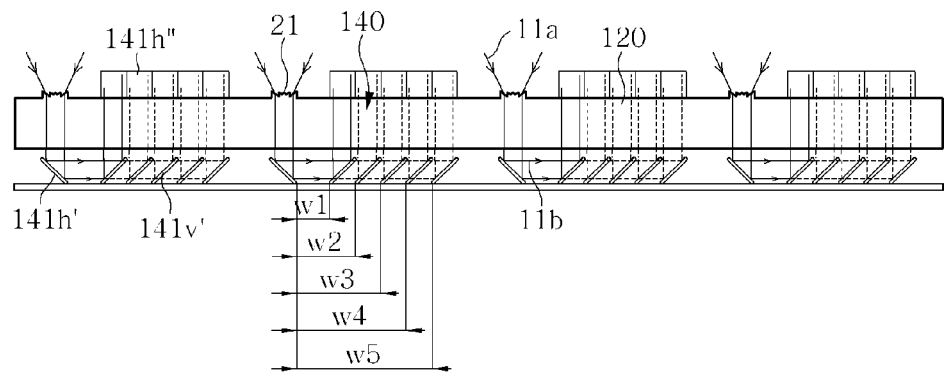
FIG. 6 is a side view illustrating an example of the alternative structure of the light guide device having multi channels.
Figure 7:
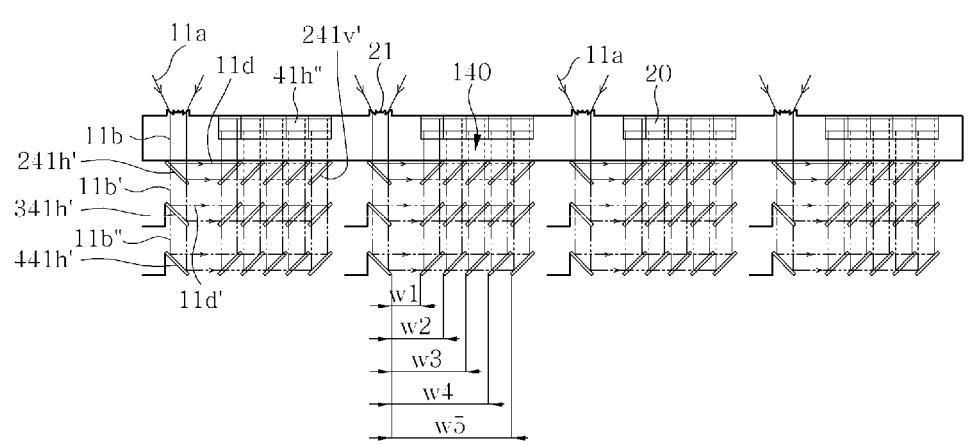
FIG. 7 is a side view illustrating another example of the alternative structure of the light guide device having multi channels.
Figure 8:
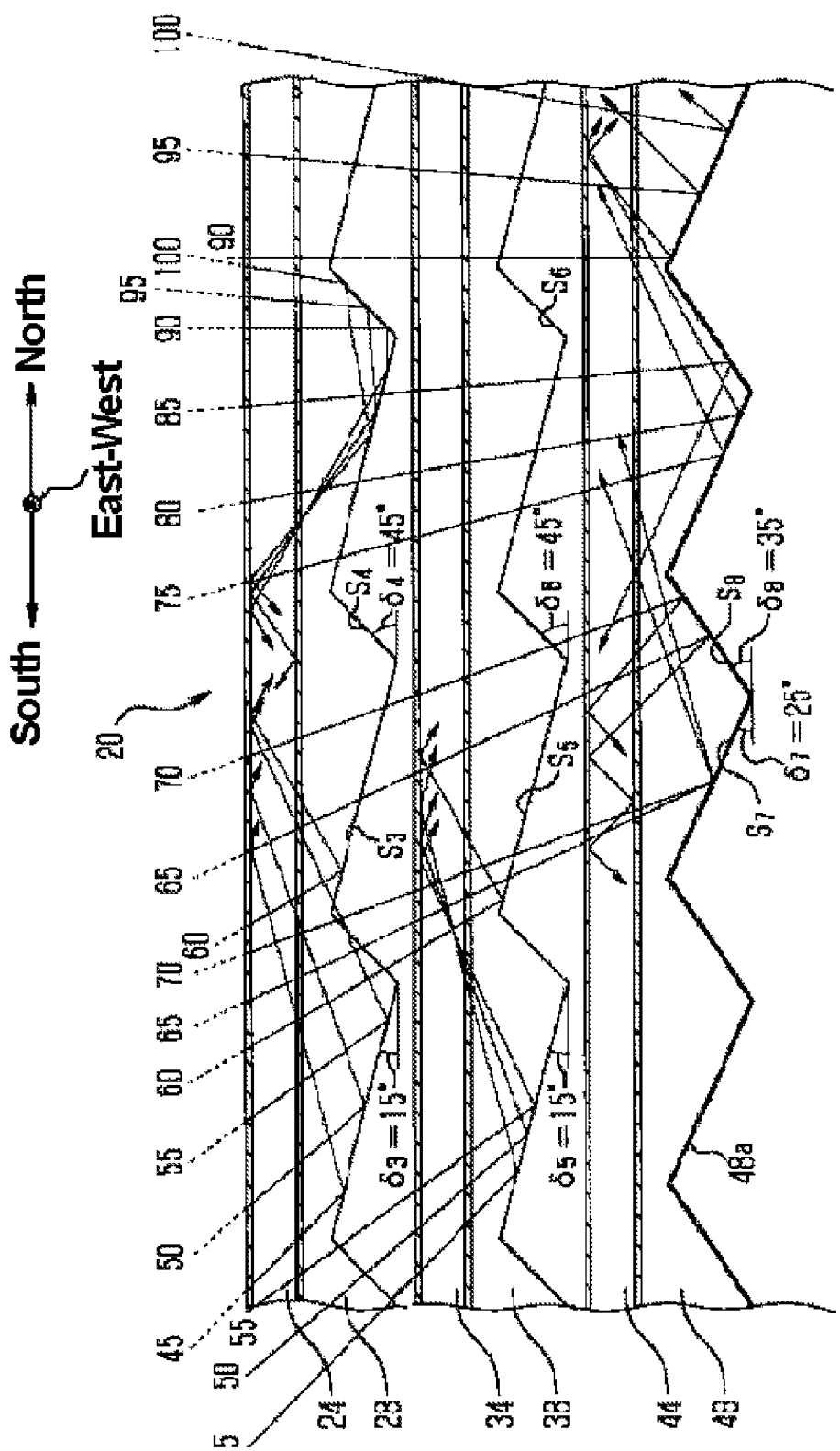
FIG. 8 is the first reference of the conventional light guide device.
Figure 9:
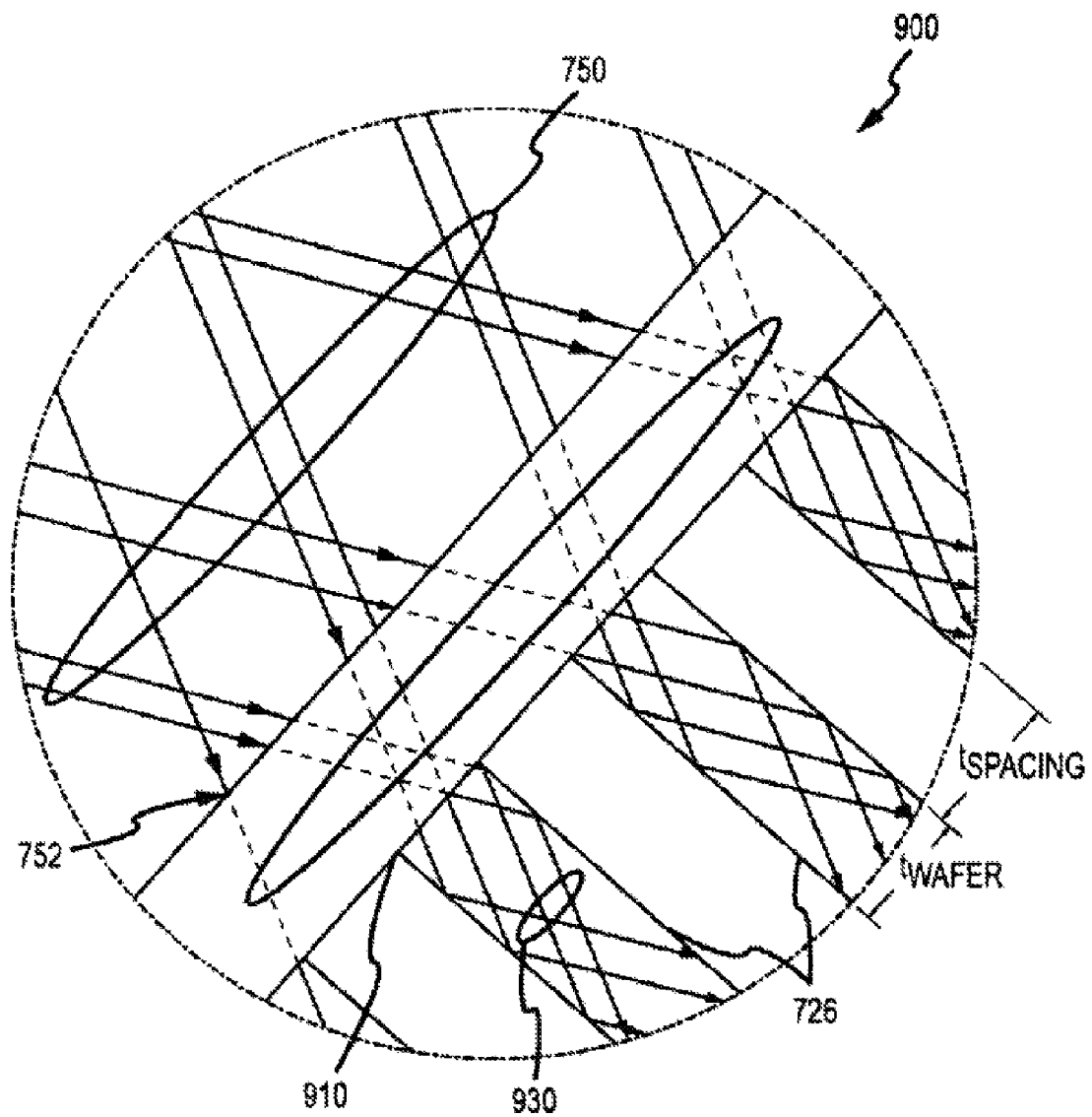
FIG. 9 is the second reference of the conventional light guide device.
Figure 10:
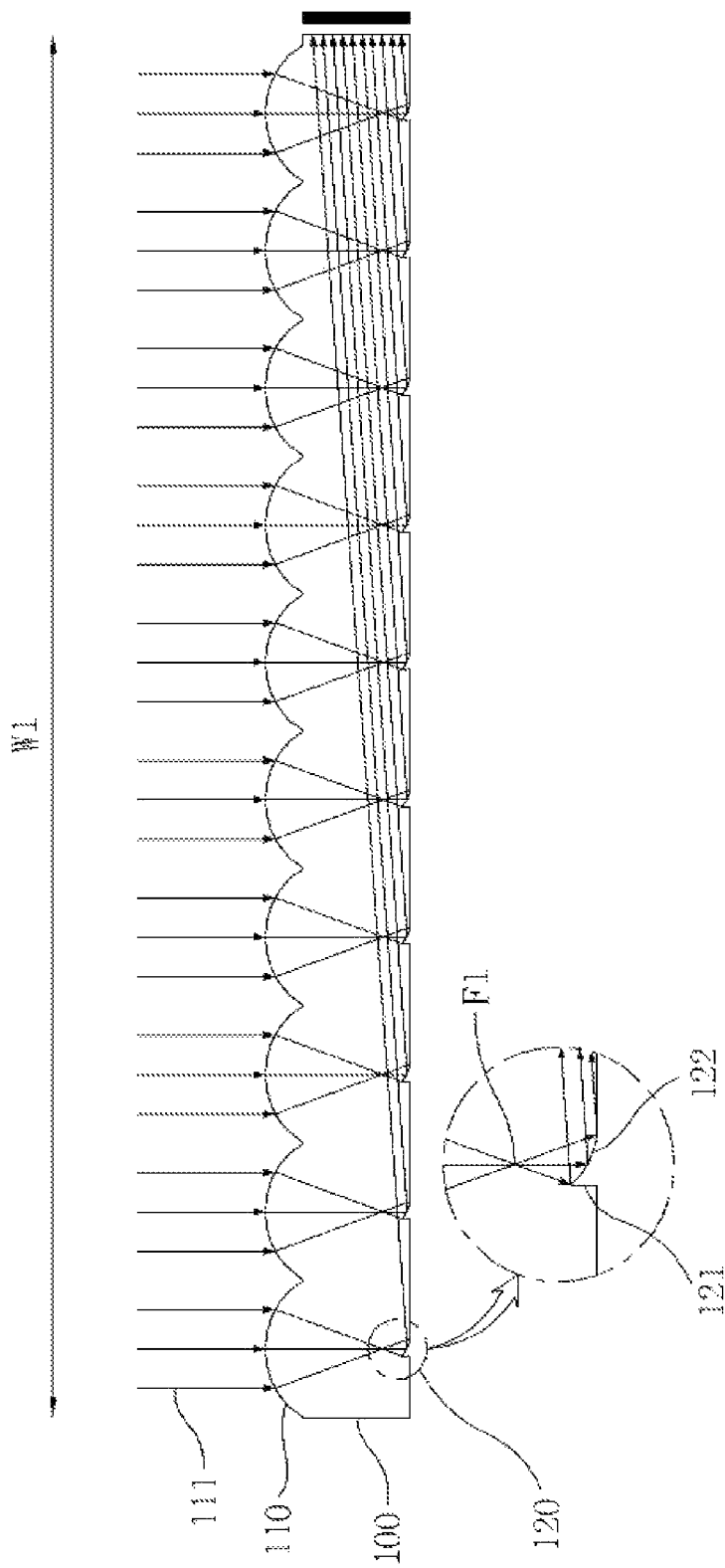
FIG. 10 is the third reference of the conventional light guide device.

On the other hand, FIG. 5 is a side view illustrating an alternative structure of the light guide device having multi channels. FIG. 6 is a side view illustrating an example of the alternative structure of the light guide device having multi channels. Finally, FIG. 7 is a side view illustrating another example of the alternative structure of the light guide device having multi channels.

A First Embodiment

As shown in FIG. 1 to FIG. 3, the first embodiment of the light guide device having multi channels is comprised of: a permeable body (10) for permeating the lights; and a channel optical concentrating unit (20) forming a one-dimensional arrangement with a predetermined interval on the body (10). There are four channel light collectors (20) being arranged with a predetermined interval on the body (10) as shown in FIG. 1 and FIG. 2. Each channel optical concentrating unit (20) has five optical module units (21), and each corresponds one-to-one with the optical channel module (40) in a one-dimensional arrangement. In the overall point of view, the optical module units (21) will correspond one-to-one with the optical channel module (40) forming a two-dimensional arrangement. The arrangement and number of channel optical concentrating units (20) is arbitrarily determined. The arrangement and number of the optical module units (21) and the optical channel module (40) per channel optical concentrating unit (20) can also be arbitrarily determined.

The channel optical concentrating unit (20) forms a predetermined interval in the one-dimensional arrangement for connecting or re-collimating the incoming light (11a). The optical module unit (21) collimates independently; the optical channel module (40) corresponds one-to-one to the optical module unit (21) formed on the body (10), which concentrates the incident beams (11a) from the optical module unit (21) for outputting the highly concentrated beam (11c) to a specific position from left-to-right, front-to-rear, or upward-to-downward.

In more detail, a first horizontal reflection unit (41h') is for totally reflecting the parallel incident lights (11b) from the optic module unit (21) to the left-to-right side in the horizontal direction. The optical channel module (40) is formed corresponding to the optic module unit (21) upward and downward. A first vertical reflection unit (41v') is for totally reflecting the transmitted lights (11e) from the first horizontal reflection unit (41h') to the upward or downward directions. The first vertical reflection unit (41v') is located at the same height of the first horizontal reflection unit (41h') to form each unique distance (w1, w2, w3, w4 and w5 in FIG. 2). A second horizontal reflection unit (41h") is arranged corresponding to the first vertical reflection unit (41v') for totally reflecting the transmitted lights (11c). So, the outputting lights will have their own unique passage to avoid interrupting each other.

As seen in FIG. 1 and FIG. 2, the first vertical reflection unit (41v') has its own unique passage (w1~w5) for totally reflecting the incident light (11b) to the second horizontal reflection unit (41h"). After reflecting, a number of lights output simultaneously from the second horizontal reflection unit (41h") to form each specifically differing distance on the plain. Each output light (11b) travels forward through its own passage, to avoid interrupting each other by the optic module unit (21), the first vertical reflection unit (41v'), and the second horizontal reflection unit (41h"). The optical channel module (40) forms the unique channel for the light to travel through its own passage in the body (10).

The optic module unit (21) is selectively formed from either one of a sole collimation means or a combined collimation and concentration means for connecting the front-incident beams. According to the present embodiment, the optic module unit (21) is a Fresnel lens as the sole collimation means. The first horizontal reflection unit (41h'), the first vertical reflection unit (41v'), and the second horizontal reflection unit (41h") has a oblique surface for totally reflecting the incident light advancing from a dense medium to a less-dense medium. A predetermined size of a right angle prism is formed in the body (10).

Herein, the light beam will totally reflect when the light is incident from the dense medium to the less-dense medium. When the deflection angle becomes 90°, it is called a critical angle. If the light incident angle is larger than the critical angle, the light will reflect instead of deflect. The deflection rate (n) is defined as:

$n=1/\sin\theta$

Further, the light concentrating means will concentrate the incident solar beams at the front first. The light concentrating means is selected from either one of Fresnel lens, non-convex lens, Cass grain optical concave mirror, or Gregorian optical prism.

The collimation means is selectively formed from either one of Fresnel lens, convex lens, concave lens, non-convex lens, non-concave lens, Green lens, sphere lens, or fiber optic guide prism. There are numerous kinds of the light concentrating means and collimation means in the optical art. So, it is easy to understand for the skilled person without more description.

On the other hand, the optic module unit (21) and the second horizontal reflection unit (41h") are manufactured first. Then, the first horizontal reflection unit (41h') and the first vertical reflection unit (41v') are separately manufactured. Finally, it is possible to assemble them together. This is easy to understand for the skilled person without more detailed description.

The permeable body (10) having a predetermined area and thickness such as a planar substrate employs a right angle prism to totally reflect the incident beam being inwardly entered in the vertical or horizontal direction. The permeable body (10) is selectively made from one of the following: plastic, tempered glass, pyrex, quartz, or silicon. The material of the body must be optically transparent. The reflection rate of the body material must be larger than that of air. If the light guide device with multi channels is used for concentrating the solar beam, the plastic has a problem to be deteriorated by the ultraviolet, even though it has a UV protecting device. Thus, it is preferable to select either one of tempered glass, pyrex, quartz, or silicon.

Preferably, the first horizontal reflection unit (41h'), the first vertical reflection unit (41v'), and the second horizontal reflection unit (41h") form a reflecting layer made of the metal material having 90% of the reflecting rate, selecting either one of aluminum, silver, gold, nickel or stainless steel.

When using a plastic material, it is normally coating the UV liquid for protecting the color-fading problem. The weathering and the color-fading problems are described in the previous patent; thus, the description will be omitted here.

Further, a method of forming the first horizontal reflection unit (41h'), the first vertical reflection unit (41v'), and the second horizontal reflection unit (41h") uses silicon/glass injection molding, silicon/glass imprinting/embossing, sand blasting, plastic injecting, laser processing, glass etching, cutting abasing, micro-optical forming by reso-graphic, rotation of cylindrical mold, compressed molding for metal molding, nano-imprinting, or embossing/stamping process, etc. There are many other producing technologies known in this art and it is easy to understand for the skilled person, so more detailed descriptions will be omitted here.

Hereinafter, the operational process will be described for the embodiment of the light guide device having multi channels:

First, the incident light beam (11a) with a preset angle enters multiple optic module units (21). Then, it is collimated by the separated beam concentrating device such as a convex lens having a parabolic specula. Finally, it is outputted as a parallel concentrated beam in the z-axis direction (FIG. 1) by the separated collimating device.

Next, the reflected beam is maintained as a parallel concentrated beam (11d) by the first horizontal reflection unit (41h'), which is reflected in the x-axis direction (right to FIG. 1). Then, the parallel concentrated beam (11d) is reflected again as the parallel concentrated beam (11e) to the z-axis direction by the first vertical reflection unit (41v'). Finally, the parallel concentrated beam (11e) is reflected again as the parallel concentrated beam (11c) to the y-axis direction by the second horizontal reflection unit (41h"), according to the principle of a right angle prism to form a unique optical passage without interrupting each other.

Accordingly, it is possible to remarkably reduce the consumption of the solar energy when the solar cells are installed on the back narrow panel. If the light guide device (1) having multiple fine channels of the present invention has one more channel on the back panel, the light beam will arrive as a parallel concentrated beam. The beam will be concentrated further to be a spot, so it is possible to easily connect and transmit through an optical cable. Therefore, it is possible to shorten the traveling length of the guide beam; it has a compact and simple structure to use a thin thickness panel to reduce the production cost. It also has merit to maximize the efficiency of the solar energy utilization.

The First Alternative Embodiment

Referring to FIG. 4, the first alternative aspect of the invention is presented. For purposes of clarity, the same reference numbers will be used in the drawings to identify similar elements.

According to the first alternative aspect of the invention, the differences between the first embodiment of the invention and the first alternative aspect of the invention are explained as follows. As explained above, the present invention is comprised of three reflection units, i.e., the first horizontal reflection unit (41$h'$), the first vertical reflection unit (41V'), and the first (or second) horizontal reflection unit (41$h''$). The channel is formed based upon the difference in the distance of the ray (w1-w5) between the first horizontal reflection unit (41$h'$) and the first vertical reflection unit (41V'). According to the first alternative aspect of the invention as shown in FIG. 4, the location of each optical module (21) is shifted backwardly when the module is mounted from the left side to the right side in order to avoid the collision of the light channels, and thus, it causes the creation of their own light channels.

The advantage of the first alternative aspect of the invention is that the light guide device does not require all three reflection units in each module. By using the horizontal reflection unit (41$h'$) only, the same or similar light beam can output to the right side of the device.

According to the first alternative aspect of the invention, in case the optical module cannot be shifted horizontally, it is possible to create the light channel without interfering each other by adjusting the depth of the first vertical reflection unit in the optical module for generating the different distances between the module and the first horizontal reflection unit (41$h$).

According to the first alternative aspect of the invention, the first horizontal reflection unit (41$h'$) can repeat the reflection of the light between the front and the back side, as well as the second horizontal reflection unit (41$h''$), which can also repeat the reflection of the light between the right side and the left side. When the third horizontal reflection unit (not shown) is added for re-directing the light from the second horizontal reflection unit (41$h''$) to the right side, and the second horizontal reflection unit (41$h''$) and the third horizontal reflection unit is separated by a certain distance, the first vertical reflection unit (41V'), the second horizontal reflection unit (41$h''$), and the third horizontal reflection unit cannot interfere with the passage of the light. Alternatively, it is possible to change the height of the mounting location, or install the second reflection unit (41$h''$) for redirecting the light upward or downward from the second horizontal reflection unit (41$h''$). The alternating method is well known and it is easy to understand for the skilled person, so more detailed descriptions will be omitted here.

Second Embodiment of the Invention

Referring to FIG. 5, the second embodiment of the invention is presented. For purposes of clarity, the same reference numbers will be used in the drawings to identify similar elements.

According to the second embodiment of the invention, the differences between the first embodiment of the invention and the second embodiment of the invention are explained as follows. The first embodiment of the light guide device (10) is made of one piece of transparent material. Each vertical reflection unit and each horizontal reflection unit forms a prism in order to change the density from the dense medium to the less-dense medium. By contrast, the reflection units (141$h'$, 141$v'$, 141$h''$) in the second embodiment of the invention are mounted on the body (10') of the light guide device. The surface of the reflection is slanted about 45 degrees.

According to the second embodiment of the invention, the light (11$a$) collected by the collecting device in multiple optical modules (21) is reflected parallel (11$b$) to the $-z$ axis direction in FIG. 3. After that, the light is reflected by the first horizontal reflection unit (141$h'$) parallel to the $-x$ axis direction. Again, the light is reflected by the first vertical reflection unit (141$v'$) to the $+z$ axis direction. Finally, the light is reflected by the second horizontal reflection unit (141$h''$) to the $-y$ axis direction. Since the distance (w1-w5) between the first horizontal reflection unit (141$h'$) and the first vertical reflection unit (141$v'$) is different in each optical module, the reflected light is focused in a small area through their own channels without interfering each other.

The Second Alternative Embodiment

Referring to FIG. 6, the second embodiment of the invention is presented. For purposes of clarity, the same reference numbers will be used in the drawings to identify similar elements.

According to the second alternative aspect of the invention, the differences between the second alternative aspect of the invention and the second embodiment of the invention are explained as follows. The second alternative aspect of the invention comprised the reflection units (141$h'$, 141$v'$, 141$h''$) mounted on the body (10') of the light guide device. The surfaces of the reflection units are slanted about 45 degrees. By contrast, an additional body (110) is provided in a space apart below the lower surface of the main body (10') in the second alternative aspect of the invention. The first horizontal reflection unit (141$h'$) and the first vertical reflection unit (141$v'$) are mounted on the upper surface of the additional body (110) within the space between the main body and the additional body.

According to the second alternative aspect of the invention, the additional body (110) is not only for supporting the reflection units, but also protects the device from the impact outside.

The Third Embodiment

Hereinafter, referring to the FIG. 7, the third embodiment of the present invention will be described in detail. The descriptions of the similar or identified items as of the first embodiment will be omitted.

The fundamental difference of the second and third embodiments is that, in the second embodiment, each optical module unit (21) generates a parallel concentrated beam (11$b$), and each reflecting unit finally outputs a parallel concentrated beam (11$c$). In the third embodiment, the splitters (241$h'$, 241$v'$, 241$h''$, 341$h'$, 341$v'$ 341$h''$) reflect a portion of the beam and deflect the rest of the beam depending on the wavelength for outputting more than two split beams.

The incident beam (11$a$) with a predetermined angle transmits to the multiple optical module unit (21) by the light concentrating unit to output a parallel concentrated beam (11$b$) by a separate collimating device (FIG. 4, bottom $-x$ axis direction). The transmitted beam (11$b$) will be separated depending on the wavelength by the first splitter (241$h'$). A portion of the split beam will be reflected in the horizontal direction and guided to maintain the parallel concentrated beam (11$d$) (shown in FIG. 7 right side $-x$ axis direction). The rest of the split beams will be reflected in the vertical direction, being guided to maintain the parallel concentrated beam (11$d'$) (shown in FIG. 5-$z$ axis direction). The guide beam normally forms a unique channel by a reflection prism or a reflecting mirror, as shown in the first and second embodiment.

Eventually, the beam having a different wavelength is guided through a separate light guide. Finally, some of the beams (11c) are guided for illumination; the other beams (11b) are guided to be a heat wave such as infrared for solar cells. Some solar cells absorb the low wavelength of the solar beam (11c); the other solar cells absorb the high wavelength of the solar beam (11b'), depending on the cell materials.

As shown in FIG. 7, at the lower portion, the transmitted beam through the first splitter (241h') will be separated according to the wavelength by the second splitter (341h'). A portion of the split beam will be guided to reflect in the horizontal direction, maintaining the parallel concentrated beam (11d') (shown in FIG. 7 −x axis direction). The rest of the split beams will be guided to reflect in the vertical direction, maintaining the parallel concentrated beam (11d") (shown in FIG. 5-z axis direction). The guide normally forms a unique channel through a reflection prism or a reflecting mirror, as shown in the first and second embodiment.

In such a case, for example, it is possible to distinguish the final optical outputs as follows: the final first optical output (11C) sets a blue light, the final second optical output (11d) sets a green light, and the final third optical output (11b") sets a red light. Alternately, it is possible to distinguish the final optical outputs as follows: the final first optical output (11C) sets ultraviolet, the final second optical output (11d') sets visible light, and the final third optical output (11b") sets infrared.

Additionally, it is possible to add a light concentrating means at the front of each optical module unit for concentrating the incident solar beams primarily. The light concentrating means is selected either one of Fresnel lens, non-convex lens, Cass grain optical concave mirror, Gregorian optical prism.

Specifically, the beam collecting unit employs a half sphere convex lens. The upper portion of the half sphere convex lens is added to the solar beam concentrating lens, which has the capability to collect the solar beams while the solar azimuth and the elevation angles vary without a separate tracking device.

Meanwhile, the light guide device having multi channels of the present invention is not limited to the above described embodiment, and various modifications are possible without departing from the scope and spirit of the invention. Accordingly, it is intended to cover various modifications and variations within the spirit and scope of the appended claims.

What is claimed is:

1. A light guide device having multi channels guides a plurality of incident collimated beams through each channel, the light guide device comprising:
   a permeable body (10') for permeating lights;
   a channel optical concentrating unit (20') formed on said permeable body (10');
   a plurality of first horizontal reflection units (41h') being arranged with constant intervals on a horizontal plane for totally reflecting incident collimated lights from each of optic module units (21) parallel to x-axis direction; and
   a plurality of optical channel modules (40') for guiding the incident collimated lights (11b) from each of the optic module units (21), so that discharged lights (11c) travel parallel to the x-axis direction on the horizontal plane;
   wherein each of the plurality of first horizontal reflection units (41h') is lined-up to the corresponded optic module unit (21) on a respective vertical plane to form its own unique channel, so that the unique channel does not interrupt with the other unique channels.

2. A light guide device having multi channels guides a plurality of incident collimated beams through each channel, the light guide device comprising:
   a permeable body (10') for permeating lights;
   a channel optical concentrating unit (20') formed on said permeable body (10');
   a plurality of first horizontal reflection units (41h') being arranged with increased depth on a vertical plane for totally reflecting incident collimated lights from each of optic module units (21) parallel to x-axis direction; and
   a plurality of optical channel modules (40') for guiding the incident collimated lights (11b) from each of the optic module units (21), so that discharged lights (11c) travel parallel to the x-axis direction on the vertical plane;
   wherein each of the plurality of first horizontal reflection units (41h') is lined-up to the corresponded optic module unit (21) with a unique depth on the vertical plane to form its own unique channel, so that the unique channel does not interrupt with the other unique channels.

3. A light guide device having multi channels guides a plurality of incident collimated beams through each channel, the light guide device comprising:
   a permeable body (10) for permeating lights;
   a channel optical concentrating unit (20) formed on said permeable body (10);
   a plurality of first horizontal reflection units (41h') for totally reflecting incident collimated lights from each of optic module units (21) parallel to x-axis direction, each of the plurality of first horizontal reflection units (41h') being lined-up to the corresponded optic module unit (21) on a respective vertical plane;
   a plurality of first vertical reflection units (41v') for totally reflecting transmitted lights from the plurality of first horizontal reflection units (41h') to a vertical direction perpendicular to the x-axis direction, each of the plurality of first vertical reflection units (41v') being lined-up to the corresponded first horizontal reflection units (41h') on the respective vertical plane;
   a plurality of second horizontal reflection units (41h") for totally reflecting the transmitted lights from the plurality of first vertical reflection units (41v') as final outputs parallel to y-axis direction perpendicular to the x-axis direction and the vertical direction, each of the plurality of second horizontal reflection units (41h") being lined-up to the corresponded first vertical reflection unit (41v') on the respective vertical plane; and
   a plurality of optical channel modules (40) being arranged with constant intervals on the horizontal plane for guiding the incident collimated lights (11b) from each of the optic module units (21), so that discharged lights (11c) travel parallel to the y-axis direction;
   wherein each of the plurality of first horizontal reflection units (41h'), the corresponded second horizontal reflection unit (41h") and the corresponded first vertical reflection unit (41v') are arranged on the respective vertical plane to form its own unique channel, so that each of the unique channels has different light-traveling distance between the respective first horizontal reflection unit (41h') and the corresponded first vertical reflection unit (41v') to avoid interruption with the other unique channels.

4. A light guide device having multi channels guides a plurality of incident collimated beams through each channel, the light guide device comprising:
   a permeable body (10) for permeating lights;
   a channel optical concentrating unit (20) formed on said permeable body (10);
   a plurality of first horizontal reflection units (41h') for totally reflecting incident collimated lights from each of optic module units (21) parallel to x-axis direction, each of the plurality of first horizontal reflection units (41*h'*) being lined-up to the corresponded optic module unit (21) on a respective vertical plane;

a plurality of first vertical reflection units (41*v'*) for totally reflecting transmitted lights from the plurality of first horizontal reflection units (41*h'*) to a vertical direction perpendicular to the x-axis direction, each of the plurality of first vertical reflection units (41*v'*) being lined-up to the corresponded first horizontal reflection units (41*h'*) on the respective vertical plane;

a plurality of second horizontal reflection units (41*h"*) for totally reflecting the transmitted lights from the plurality of first vertical reflection units (41*v'*) as final outputs parallel to y-axis direction perpendicular to the x-axis direction and the vertical direction, each of the plurality of second horizontal reflection units (41*h"*) being lined-up to the corresponded first vertical reflection unit (41*v'*) on the respective vertical plane; and a plurality of optical channel modules (40) being arranged with constant intervals on the horizontal plane for guiding the incident collimated lights (11*b*) from each of the optic module units (21), so that discharged lights (11*c*) travel parallel to the y-axis direction;

wherein each of the plurality of first horizontal reflection units (41*h'*), the corresponded second horizontal reflection unit (41*h"*) and the corresponded first vertical reflection unit (41*v'*) are arranged on the respective vertical plane and the corresponded second horizontal reflection unit (41*h"*) having a unique depth in order to form its own unique channel, so that each of the unique channels has different height in the final output light to avoid interruption with the other unique channels.

5. The light guide device having multi channels according to claim 1, wherein said permeable body (10) has a predetermined area, thickness and an optical refraction rate, which is larger than that of air, optically transparent material.

6. The light guide device having multi channels according to claim 5, wherein said permeable body (10) is made one of a plastic, tempered glass, Pyrex, quartz or silicon.

7. The light guide device having multi channels according to claim 1, wherein each of the plurality of first horizontal reflecting units has a concave groove being formed a reversed V shape or a right triangle shape on the permeable body (10), and wherein the bevel surface of the concave groove is totally reflected the collimated lights from a dense medium to a less-dense medium according to the principle of a right angle prism to form an optical passage.

8. The light guide device having multi channels according to claim 7, wherein said bevel surface of the concave groove forms a reflecting layer to increase efficiency of a reflection rate, and wherein said reflecting layer is selectively coated with one of aluminum, silver, gold, nickel or stainless steel.

9. The light guide device having multi channels according to claim 1, wherein each of the plurality of first horizontal reflecting units forms a reflecting mirror attached on the body.

10. The light guide device having multi channels according to claim 1, wherein each of the plurality of optical channel modules further comprising;

a lower panel (110) being formed in parallel and apart from the body (10), wherein each of the plurality of first horizontal reflecting units is consisted of a reflecting mirror attached on the body, and wherein said reflecting mirror is attached on the lower panel (110).

11. The light guide device having multi channels according to claim 1, wherein each of the optic module units (21) is any one of a linear optical concentrating convex lens unit, a linear optical concentrating Fresnel lens unit, a linear optical concentrating non-convex lens unit, a linear optical concentrating Green lens unit, a linear optical concentrating Fiber-optic taper unit, a linear optical concentrating Gregorian optical mirror unit having bottom window, an optical concentrating convex lens unit, an optical concentrating Fresnel lens unit, an optical concentrating non-convex lens unit, a diffusion Green lens, an optical concentrating Fiber-optic taper unit, a Gregorian optical mirror unit, and a Cass grain optical mirror unit.

12. The light guide device having multi channels according to claim 1, wherein each of the plurality of first horizontal reflecting units is a prism for splitting incident solar beams according to the wavelength, a partial portion of the split beams being guided in the vertical direction, and the remaining split beams being guided for reflection in the horizontal direction.

13. The light guide device having multi channels according to claim 3, wherein each of the plurality of optical channel modules further comprising;

a third horizontal reflecting unit for totally reflecting the transmitted beam from the corresponded second horizontal reflecting unit in the horizontal direction.

14. A solar beams concentration apparatus comprising the light guide device according to claim 1, wherein the light concentration apparatus further comprising;

a third concentrating device receiving linear collimated solar beams being concentrated two times by the light guide device and concentrating the linear collimated solar beams one more time.

* * * * *